United States Patent
Finn et al.

(10) Patent No.: US 10,504,218 B2
(45) Date of Patent: Dec. 10, 2019

(54) METHOD AND SYSTEM FOR AUTOMATED INSPECTION UTILIZING A MULTI-MODAL DATABASE

(71) Applicant: UNITED TECHNOLOGIES CORPORATION, Farmington, CT (US)

(72) Inventors: Alan Matthew Finn, Hebron, CT (US); Hongcheng Wang, Farmington, CT (US); Ziyou Xiong, Wethersfield, CT (US)

(73) Assignee: UNITED TECHNOLOGIES CORPORATION, Farmington, CT (US)

(*) Notice: Subject to any disclaimer, the term of this patent is extended or adjusted under 35 U.S.C. 154(b) by 186 days.

(21) Appl. No.: 14/692,302

(22) Filed: Apr. 21, 2015

(65) Prior Publication Data
US 2016/0314571 A1    Oct. 27, 2016

(51) Int. Cl.
*G06K 9/00* (2006.01)
*G06T 7/00* (2017.01)
(Continued)

(52) U.S. Cl.
CPC ............ *G06T 7/0004* (2013.01); *G06F 16/40* (2019.01); *G06F 17/5086* (2013.01);
(Continued)

(58) Field of Classification Search
CPC ......... G06T 7/0004; G06T 5/50; G06T 7/001; G06T 2207/20221; G06T 2207/30164;
(Continued)

(56) References Cited

U.S. PATENT DOCUMENTS 5,070,401 A * 12/1991 Salvati ................. G01B 11/024
                                              348/141
5,426,506 A *  6/1995 Ellingson .............. G01N 21/88
                                              250/225

(Continued)

OTHER PUBLICATIONS

European Search Report for EP Application No. 16166082.4-1906; dated Sep. 26, 2016; 11 pgs.

(Continued)

*Primary Examiner* — Samir A Ahmed
(74) *Attorney, Agent, or Firm* — Cantor Colburn LLP

(57) ABSTRACT

A method and system for performing automated defect detection is disclosed. The system may include at least one database, an image capture device and a processor. The method may comprise providing at least one database for storing information used in processing data to detect a defect in at least one member of a plurality of members in a device. The information may include a plurality of different modes of data. The method may further comprise providing a processing unit for processing the information; receiving, by the database, updates to the information; identifying a potential defect in a first mode of data; applying, by the processing unit, analysis of a second mode of data, the analysis of the second mode of data triggered by the identifying, the second mode of data different than the first mode of data; and reporting defects based on the results of the applying.

4 Claims, 2 Drawing Sheets

(51) Int. Cl.
*G06F 16/40* (2019.01)
*G06F 17/50* (2006.01)
*G06K 9/62* (2006.01)
*G06N 7/00* (2006.01)
*G06T 5/50* (2006.01)

(52) U.S. Cl.
CPC .......... *G06K 9/6278* (2013.01); *G06N 7/005* (2013.01); *G06T 5/50* (2013.01); *G06T 7/001* (2013.01); *G06T 2207/20221* (2013.01); *G06T 2207/30164* (2013.01)

(58) Field of Classification Search
CPC .......... G06F 17/30017; G06F 17/5086; G06K 9/6278; G06N 7/005
See application file for complete search history.

(56) References Cited

U.S. PATENT DOCUMENTS

| | | | | |
|---|---|---|---|---|
| 6,597,818 | B2* | 7/2003 | Kumar | G06T 3/0081 382/284 |
| 7,337,058 | B1 | 2/2008 | Mylaraswamy et al. | |
| 7,840,367 | B2* | 11/2010 | Little | G01B 5/008 250/559.3 |
| 8,314,834 | B2* | 11/2012 | Konomura | G01N 21/954 348/45 |
| 2002/0128790 | A1* | 9/2002 | Woodmansee | B23P 6/002 702/81 |
| 2003/0063270 | A1* | 4/2003 | Hunik | F01D 21/003 356/32 |
| 2004/0183900 | A1* | 9/2004 | Karpen | G01N 21/8803 348/92 |
| 2005/0288901 | A1 | 12/2005 | Mylaraswamy et al. | |
| 2007/0217672 | A1* | 9/2007 | Shannon | G06T 7/0006 382/152 |
| 2009/0138231 | A1* | 5/2009 | Little | G01B 11/03 702/152 |
| 2009/0201364 | A1* | 8/2009 | Konomura | G01N 21/954 348/65 |
| 2009/0307628 | A1 | 12/2009 | Metala et al. | |
| 2011/0087443 | A1* | 4/2011 | Zhang | G01N 29/0654 702/39 |
| 2012/0330447 | A1* | 12/2012 | Gerlach | G01B 11/24 700/95 |
| 2013/0114878 | A1* | 5/2013 | Scheid | G06T 7/001 382/141 |
| 2013/0114879 | A1* | 5/2013 | Scheid | G06T 7/001 382/145 |
| 2016/0239584 | A1* | 8/2016 | Steele, Jr. | G06F 17/50 |

OTHER PUBLICATIONS

Title: "Multisensor data fusion in dimensional metrology"; Author: A. Weckenmann et al.; Elsevier; CIRP Annals-Manufacturing Technology 58 (2009) 701-721; 21 pgs.

European Office Action for Application No. 16 166 082.4-1210; dated Apr. 19, 2018; 9 pgs.

* cited by examiner

METHOD AND SYSTEM FOR AUTOMATED INSPECTION UTILIZING A MULTI-MODAL DATABASE

TECHNICAL FIELD OF THE DISCLOSURE

The present disclosure relates to automated inspection techniques and, more particularly, relates to automated visual inspection techniques of images or videos captured by image capture devices such as borescopes.

BACKGROUND OF THE DISCLOSURE

Video inspection systems, such as borescopes, have been widely used for capturing images or videos of difficult-to-reach locations by "snaking" image sensor(s) to these locations. Applications utilizing borescope inspections include automated video damage inspection, aerospace engine inspection, power turbine inspection, internal inspection of mechanical devices, medical endoscope inspection, and the like.

A variety of techniques for inspecting the images or videos provided by borescopes for determining defects therein have been proposed in the past. Most such techniques capture and display images or videos to human inspectors. Human inspectors then decide whether any defect within those images or videos exists. For engine inspection, when human inspectors look at many similar images of very similar blades of an engine stage, sometimes they miss defects because of the repetitive nature of the process or because of physical, visual, or mental fatigue experienced by the inspector. Missing a critical defect may lead to customer dissatisfaction, transportation of an expensive engine back to a service center, lost revenue, or lack of desired engine performance. Equally, there are adverse consequences for missed damage detection in other applications.

Accordingly, it would be beneficial if an improved technique for performing defect detection were developed that utilized multiple modes of information.

SUMMARY OF THE DISCLOSURE

In accordance with one aspect of the present disclosure, a method of performing automated defect detection utilizing multi-modal analysis of information is disclosed. The method may comprise providing at least one database for storing information used in processing data to detect a defect in at least one member of a plurality of members in a device. The information may include a plurality of different modes of data. The method may further comprise providing a processing unit for processing the information; receiving, by the database, updates to the information; identifying a potential defect in a first mode of data; applying, by the processing unit, analysis of a second mode of data, the analysis of the second mode of data triggered by the identifying, the second mode of data different than the first mode of data; and reporting defects based on the results of the applying.

In accordance with yet another aspect of the present disclosure, a system for automated defect detection utilizing multi-modal analysis of information is disclosed. The system may comprise a database that stores information used in processing to detect a defect in at least one member of a plurality of members in a device, an image capture device that captures and transmits to the database image data of the members inside the device, and a processor. The information may include a plurality of modes of data. The processor may be configured to apply, upon receipt of updates to the information, multi-modal analysis using at least two different modes of data, and to identify defects based on the results of the multi-modal analysis.

In accordance with another aspect of the present disclosure, a method of performing automated defect detection utilizing multi-modal analysis of information is disclosed. The method may comprise providing at least one database for storing the information used in processing to detect a defect in at least one blade of a plurality of blades in an engine, the information including a plurality of modes of data, providing a processing unit for processing the information, receiving, by the database, updates to the information, identifying a potential defect in a first mode of data, applying, by the processing unit, analysis of a second mode of data, the analysis of the second mode of data triggered by the identifying, the second mode of data different than the first mode of data, and reporting defects based on the results of the applying.

While the present disclosure is susceptible to various modifications and alternative constructions, certain illustrative embodiments thereof will be shown and described below in detail. It should be understood, however, that there is no intention to be limited to the specific embodiments disclosed, but on the contrary, the intention is to cover all modifications, alternative constructions, and equivalents falling within the spirit and scope of the present disclosure.

DETAILED DESCRIPTION OF THE DISCLOSURE

Figure 1:
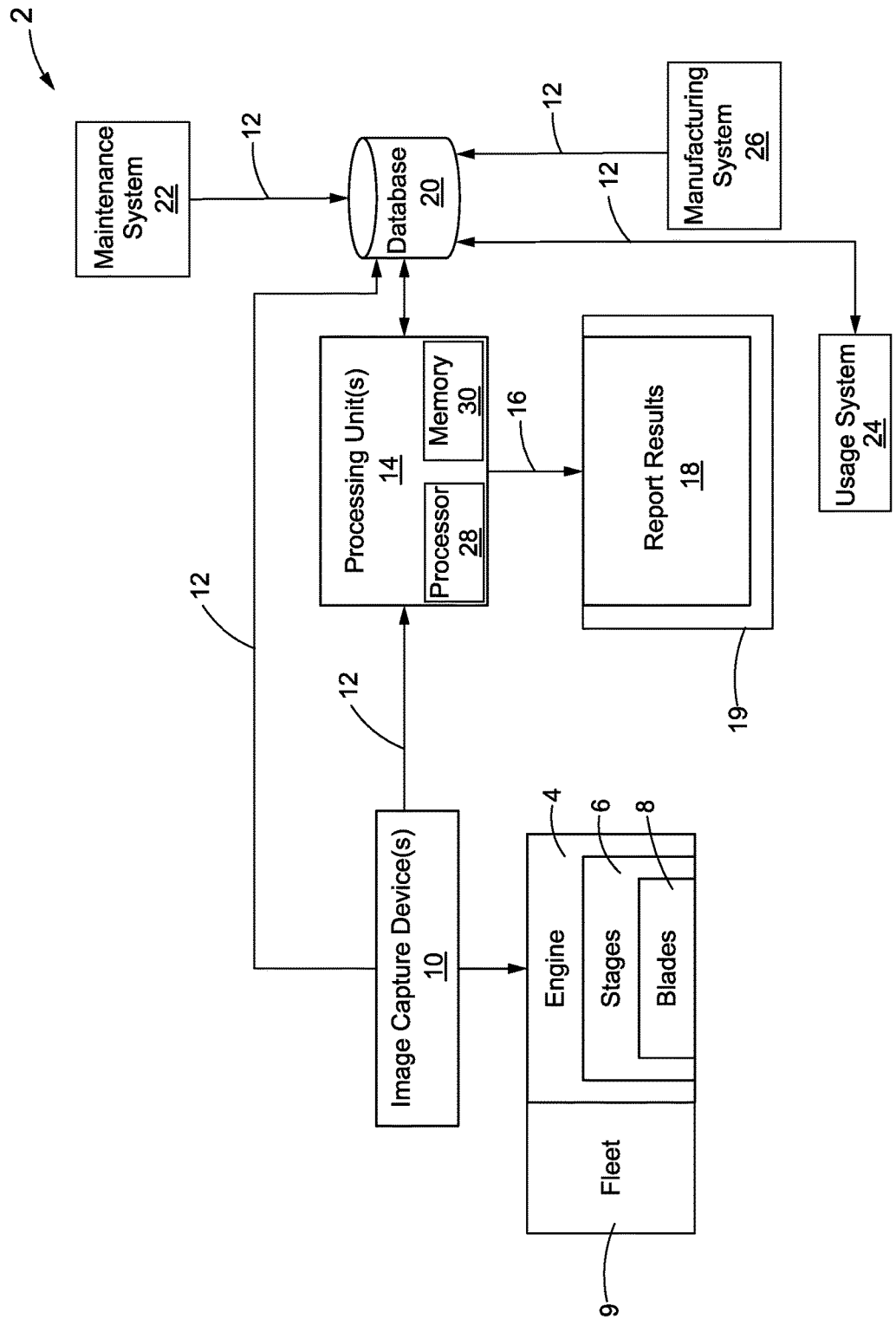
FIG. 1 is a schematic illustration of an embodiment of an automated inspection system, in accordance with the present disclosure.

Referring to FIG. 1, a schematic illustration of an automated defect detection system 2 is shown, in accordance with at least some embodiments of the present disclosure. In at least some embodiments, the automated defect detection system 2 may be an automated borescope inspection (ABI) system. As shown, the ABI system 2 may include an engine 4 having a plurality of stages 6, each of the stages having a plurality of blades 8, some or all of which may require visual inspection over time. The engine 4 may be representative of a wide variety of engines such as jet aircraft engines, aeroderivative industrial gas turbines, steam turbines, diesel engines, automotive and truck engines, and the like. The engine 4 may be part of a fleet 9 of engines 4. In some embodiments, the fleet 9 may be just those in the same aircraft or, more generally, a large number of engines in different aircraft. Notwithstanding that the present disclosure has been described in relation to inspection of the blades 8 of an engine 4, in other embodiments, the ABI system 2 may be employed to inspect other parts of the engine 4, as well as to perform inspection on the parts or members of other types of equipment and devices. Such parts/members are not limited to blades 8. For example, the ABI system 2 may be used for processing medical endoscope images, inspecting critical interior surfaces in machined or cast parts, forensic inspection, inspection of civil structures such as buildings bridges, piping, etc.

The image capture device 10 may be an optical device including an optical lens or other imaging device or 2D or 3D image sensor at one end. In an alternative embodiment, image capture device 10 may be operable in a portion of the electromagnetic spectrum not visible to the human eye such as infrared or millimeter wave frequencies or may even be operable in acoustic frequencies audible or not to the human ear. The image captured by image capture device 10 may be as small as 1 pixel by 1 pixel, although typically it will be larger. Image capture device 10 may capture a single image or may capture multiple images at regular or irregular intervals. Image capture device may additionally include metrology information along with the images. In the case of a 3D image sensor, the features depth is also measured. Such 3D image sensors use alternative techniques, including structured light measurement, phase shift measurement, time of flight measurement, stereo triangulation device, sheet of light triangulation device, light field cameras, coded aperture cameras, computational imaging techniques, simultaneous localization and mapping (SLAM), imaging radar, imaging sonar, scanning LIDAR, flash LIDAR, and the like. As is known in the art, the image capture device 10 is configured to capture and transmit images or videos through a communication channel 12 to a processing unit 14. In an embodiment, the image capture device 10 may be representative of any of a variety of flexible borescopes or fiberscopes, rigid borescopes, video borescopes or other devices such as endoscopes which are capable of capturing and transmitting images or videos of difficult-to-reach areas through the communication channel 12.

A database 20 may be in communication with the processing unit 14 via a communication channel 12. The database 20 may be a plurality of databases. The plurality of databases may be in communication with each other but remotely located from one another. In one embodiment, but not necessarily all of the embodiments, the processing unit 14 and database 20 may be remotely located and may utilize one or more remote servers that are networked to store, manage and process data, i.e. cloud computing, to allow logically centralized data storage and online access to computer services or resources.

The database 20 may store information used in processing to detect a defect in a blade 8. The information received and stored by the database 20 may include a plurality of different modes (types) of data from a plurality of different sources. For example, the modes of data may include, but are not limited to, manufacturing data, usage data, maintenance data, Image Based Defect Data (as defined herein), Multi-Modal (MM) Analysis Data (as defined herein), image or video data of the blades 8 inside the engine 4, composite data (as explained below), results, or the like. Such information may be indexed or organized by geographic location; fleet 9 model; engine 4 model; stage 6; blade 8 model; supplier; type, duration, or environment of use or application; or any other type of appropriate indexing.

The processing unit 14 may receive and process one or more images of the blades 8 that are captured and transmitted by the image capture device 10 via the communication channel 12. The set of images may be sequential in terms of the order in which they are captured by the image capture device 10 (e.g. image one followed by image two, etc.). In other embodiments, the images may be non-sequential with regard to the order in which the images were captured by the image capture device 10. For example, every third image captured by the image capture device 10 may be received by the processing unit 14. In some embodiments, but not all embodiments, the blades 8 may be in motion or rotating in the engine 4. For example, the blades 8 may rotate toward or away from the image capture device 10 when the images are being captured. The images captured may be of the same blade 8 in different positions in the field of view of the image capture device 10 and/or may be of a plurality of blades 8 in different positions in the field of view of the image capture device 10. Thus, there may be periodic or semi-periodic motion in the recorded videos of such inspected engine blades 8.

The processing unit 14 may include a processor 28 and a memory component 30. Processor 28 may automatically process the images upon receiving the images using programs stored in memory component 30 to determine whether there are any defects or potential defects within any of the blades 8 ("Image Based Defect Data"), and whether there are any changes/propagations of defects from previous inspections. The resulting Image Based Defect Data may include information about the type of defect, the location of the defect, size of the defect, etc. and, as noted above, may be stored in the database 20. The processor 28 may be a microprocessor or other processor or logic device. In some embodiments, the processor 28 may execute instructions and generate control signals for processing images from image capture device 10. The processor 28 may execute instructions and generate control signals for causing capture of images by image capture device 10 or storage or retrieval of information from database 20. The processor 28 may also execute instructions and generate control signals for causing reporting of results 18 or display on a user interface 19. Such processor 28 instructions that are capable of being executed by a computer may be read into or embodied on a computer readable medium, such as the memory component 30 or provided external to the processor 28. In alternative embodiments, hard wired circuitry may be used in place of, or in combination with, software instructions to implement a control method. The term "computer readable medium" as used herein refers to any non-transitory medium or combination of media that participates in providing instructions to the processor 28 for execution. Such a medium may comprise all computer readable media except for a transitory, propagating signal. Forms of computer-readable media may include any medium from which a computer processor 28 can read. The processing unit 14 is not limited to one processor 28 and memory component 30. The processing unit 14 may be several processors 28 and memory components 30. In alternative embodiments memory component 30 may be located remote from processing unit 14 and operably interconnected with the processing unit 14.

In some embodiments, the image capture device 10 may also be configured to capture and transmit images or videos through another communication channel 12 to the database 20 for storage of the raw unprocessed images or videos.

One or more maintenance systems 22 may be in communication with the database 20 via a communication channel 12. The maintenance system 22 may be configured to transmit (to the database 20) maintenance data related to or associated with the blade 8 under inspection. Such maintenance data may include maintenance data related to: the individual blade 8 under inspection or like blades, the blade 8 model, the stage 6 of the engine 4 (or in similar engines 4), other stages 6 in the engine 4 (or in other similar engines 4), the engine 4 or other similar engines 4 (same or different model) that utilize the same or similar blades 8, the fleet 9 in which the engine 4 is disposed or other fleets 9 utilizing the same or similar engines 4. The maintenance data may further include, but is not limited to, previous failures or defects identified for a blade 8, identification of statistically abnormal quantities of failures of one or more types of blades 8 in a given engine 4, fleet 9 of like engines 4, engines 4 from a given supplier, blades 8 of a given material or manufacturing lot number (the lot number generally enables tracing of the constituent parts as well as labor and equipment records involved in the manufacturing of the product), and the remaining safe life prediction for a blade 8. As is known in the art, the safe life prediction for a blade 8 is a statistical model and/or a physics-based model that, with the predicted usage, allow extrapolation of the remaining defect-free life of a part. These models may include, for instance, the operating environment, usage stresses, expected maintenance, known defect propagation, and safety requirements. The statistical models, for instance, might be Bayesian, Extreme Value (Weibull, Gumbek Frechet), or others. The maintenance data may be stored on the database 20.

Usage data related to the blade 8 under inspection may be transmitted to the database 20 from one or more usage system(s) 24 via a communication channel 12. In some embodiments, the usage system 24 may be a part of the maintenance system 22, or other system. Usage data may include, but is not limited to, the tachometer hours on the engine 4, data indicative of whether the engine 4 is used in long haul flights or short haul, data on the operating environment (e.g., ambient temperature, presence of particulates in the air such as sand, etc.). The usage data may be stored on the database 20.

Manufacturing data related to the blade 8 under inspection may be transmitted to the database 20 for storage via a communication channel 12. Such manufacturing data may be transmitted by a manufacturing system 26. Such manufacturing data may include for the bade 8 under inspection, but is not limited to, Computer-Aided Design (CAD) models of blade 8, the bill of material for the blade 8 or stage 6 or engine 4, the material batch for the blade 8, the material processing of the blade 8, suppliers of the blade 8, the manufacturing date of the blade 8, and the like. Manufacturing data may be stored on the database 20.

The communication channel(s) 12 may be an optical channel or alternatively, may be any other wired, wireless or radio channel or any other type of channel capable of transmitting images, videos or data between two points including links involving the World Wide Web (www) or the internet.

Results (e.g., the defects or potential defects) 18 of automated analysis performed on some or all of the above data stored in the database 20 may then be reported through communication channel 16 and stored on the database 20. In some embodiments, the results 18 may be displayed on a user interface 19. The user interface 19 may be configured to receive user input that accepts or rejects the displayed defect or potential defect.

Similar to the communication channel 12, the communication channel 16 may be any of variety of communication links including, wired channels, optical or wireless channels, radio channels or possibly links involving the World Wide Web (www) or the internet. Reporting of the results 18 may involve storing the results in the database 20 for future reference, as well as displaying the results on the user interface 19 or raising alarms when defects are detected.

Figure 2:
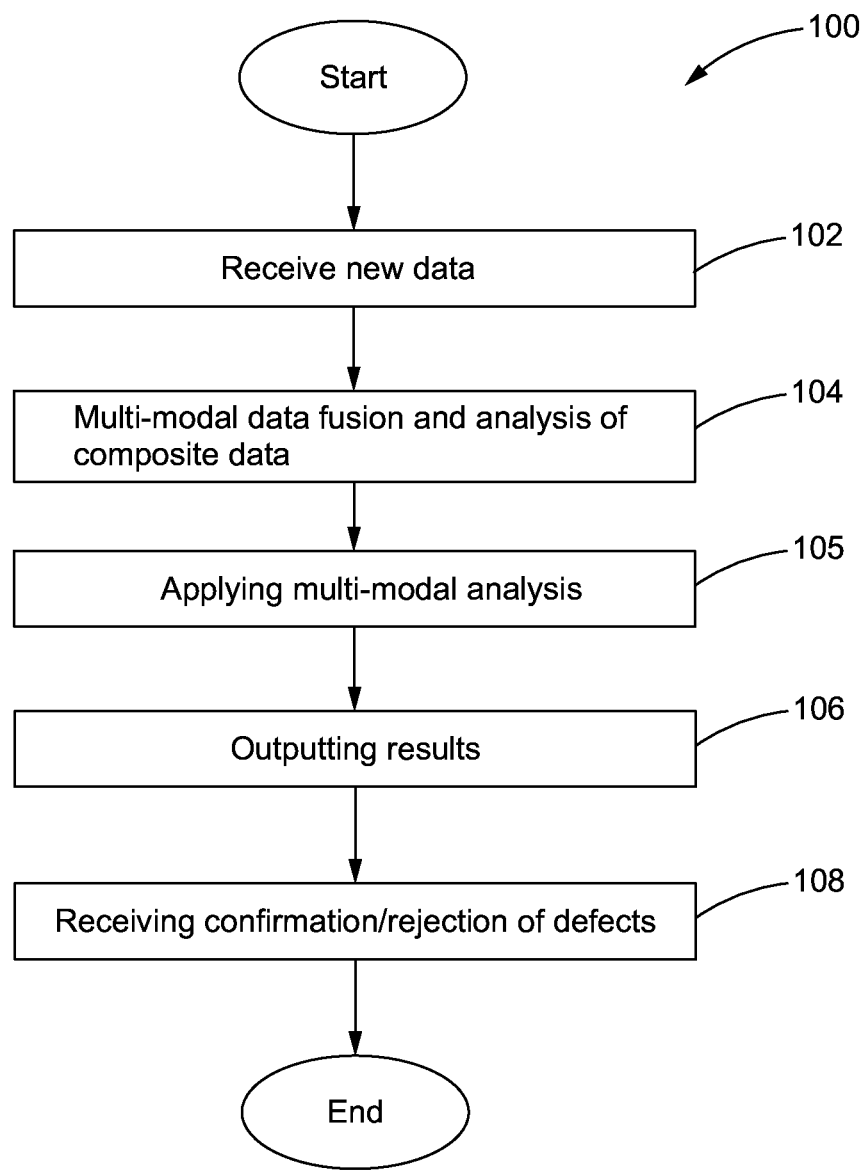
FIG. 2 is a flowchart illustrating exemplary steps of automated defect detection in accordance with the present disclosure.

FIG. 2 is an exemplary flowchart 100 showing sample blocks which may be followed in performing automated defect detection using the ABI system 2.

Block 102 includes receiving updates (including new data) to the information stored on database 20 that is related directly or indirectly to the blade 8. The updates may be, for example, updates to the manufacturing data, usage data, maintenance data, Image Based Defect Data, MM Analysis Data, image or video data of the blades 8, composite data, results, or the like.

Block 104 includes using multi-modal data fusion of different modes of data to create composite data, and analyzing the composite data for a potential defect. Multi-modal data fusion refers to the combination of different data inputs/types or different modes of data (each related to the blade 8) into composite data for comparison/analysis. For example, image data of a blade 8 stored in the database 20 may be overlaid on a 3-D CAD model of the shape of the blade 8 that is also stored in the database 20. The shape of the 3-D model may be fit to the image of the blade 8, either manually or automatically. Such shape matching/fitting may utilize linear or non-linear registration techniques known in the art. Many other MultiModal analyses and resulting composite types of data are possible.

During analysis of such composite data, a large deviation of shape matching, e.g., a large error from a linear registration or a large non-linear deformation to achieve a good match for non-linear registration may indicate a possible defect in the shape of the blade 8. Data fusion and analysis of composite data can be at an early stage in the analysis or, alternatively, at a later stage to determine whether a defect is present or not. Such data fusion and analysis of composite data may be automatically triggered by the receipt of updates to the information in block 102. The composite data, as well as the results of analysis of the composite data, may be stored in the database and may trigger further automated analysis.

Block 105 includes applying by the processing unit 14 multi-modal analysis using different modes (types) of data and utilizing new, updated data and existing data related directly or indirectly to the blade 8. Such multi-modal analysis of different modes of data may be automatically triggered by the receipt of updates to the information. More specifically, a possible defect detected via one mode (type) of data can trigger an examination of another mode of data. For example, a possible defect detected via the comparison between the image data of a blade 8 overlaid on a 3-D CAD model of the shape of the blade 8 may then trigger analysis of the manufacturing record of the blade 8 to see whether a similar defect trend persists across a family of similar blades 8 or different blades 8 manufactured by a given supplier. The analysis may include statistical analysis to determine the probability and trend of failure with respect to different engines 4, models, stages 6 or blades 8 with time across different geographic locations, applications etc. The results of multi-modal analysis (the "MM Analysis Data") may be considered another mode of data that may be stored on the database(s) and utilized in other multi-modal analysis or may be reported as a defect or potential defect.

Bayesian analysis, as is known in the art, may be utilized not only as part of the multi-modal analysis of various data, but also to determine the final prioritization of results 18 to be output. A Bayesian analysis in probability theory and statistics relates the current probability to prior probability and any new measurements (data). In summary, it is used to compute the posterior probability of a defect given the new and prior data. A ranked list of failure parts/regions are generated based on the estimated probability from Bayesian analysis. The higher the probability is, the higher it is on the ranked list.

Block 106 includes providing or outputting prioritized results 18 for inspection based on the results of the analysis. Such prioritized results are those anomalies identified by the system 2 as likely defects. In an embodiment, such anomalies may be those that are over a threshold and may be prioritized according to their deviation from the threshold. In another embodiment, the output prioritized results may include all anomalies found, or may include all anomalies found but with an indicator of which anomalies are above the threshold. The results may be displayed for further review by a human to confirm the identification of the anomaly as a likely defect (for example, on a pass/fail basis) or may be automatically reported as defect.

An inspector may inspect the regions of the displayed (or reported) list based on priority (for example, inspecting those anomalies with a higher probability of a defect before those with lower probability of a defect), available lower level detail, or speed of inspection (for example, those anomalies that can be relatively quickly inspected). Usually an inspector will inspect the regions with higher probability first by spending more time and inspecting more carefully. In some embodiments, different levels of detail may be provided or may be available for review for some or all of the anomalies/potential defects reported. For example, some anomalies/potential defects reported/displayed may be reviewed or inspected based on the information initially shown (for the anomalies/potential defects) on the displayed list, and a confirmation of an anomaly as a defect or a rejection of the anomaly as a defect (a potential defect determined not to be a real defect) may be made by the inspector without accessing more detailed information related to the anomaly/potential defect. In other cases, an inspector may want to review some or all of the other information available that is related to the anomaly/potential defect and may access that information through links or the like displayed with the anomaly/potential defect on the result list.

An adaptive inspection is provided when the system 2 recommends inspection priorities based on the multi-modal analysis of data, related directly and indirectly to the blade 8, that considers the images or video of the blades 8, Image Based Defect Data, maintenance data, usage data, manufacturing data, trends, remaining safe life prediction for the current engine, CAD or other design models, or more than one engine of a given model, and is not just simply a comparison to a previous image or video. For example, because the probabilities of defect change as a result of inspection, inspecting one part of one engine may result in processing unit 14 or maintenance system 22 recommending further inspection of another part of the same engine or a recommending various inspections of other engines. Thus, in some embodiments, the results displayed may be dynamically updated and reprioritized based on the inspection results (confirmation/rejection of anomalies as defects) in Block 108.

Block 108 includes receiving, by the processing unit, confirmation or rejection of the defects from a user interface.

INDUSTRIAL APPLICABILITY

In general, the present disclosure sets forth a system and method for performing automated defect detection. The method may include providing at least one database for storing the information used in processing to detect a defect in at least one member of a plurality of members in a device, the information including a plurality of different modes of data; providing a processing unit for processing the information; receiving, by the database, updates to the information; identifying a potential defect in a first mode of data; applying, by the processing unit, analysis of a second mode of data, the analysis of the second mode of data triggered by the identifying, the second mode of data different than the first mode of data; and reporting defects based on the results of the applying. In an embodiment, the reporting may include presenting the defects on a user interface 19 for acceptance or rejection. The method may further include receiving, by the processing unit 14, confirmation or rejection of the defects from a user interface 19.

The present disclosure provides for an automated inspection using automatic analysis in which human involvement is minimized, thereby minimizing human related errors and improving inspection reliability and speed. Also, the present disclosure teaches defect detection using multiple modes of data to improve the quality and reliability of the defect detection.

While only certain embodiments have been set forth, alternatives and modifications will be apparent from the above description to those skilled in the art. These and other alternatives are considered equivalents and within the spirit and scope of this disclosure and the appended claims.

What is claimed is:

1. A method for detecting a defect in a part of a gas turbine engine comprising:
    receiving image data of the part from an image capture device;
    using the image data and another type of data about the part other than the image data to create composite data through multi-modal data fusion, wherein the another type of data is a 3-D CAD model of a shape of the part, and the multi-modal data fusion comprises overlaying the 3-D CAD model of the shape of the part on the image data of the part to create the composite data;
    identifying a potential defect in the part by analyzing the composite data by computing a posterior probability of a potential defect based on new data and prior data of the composite data and generating a ranked list of failure parts/regions based on the posterior probability to identify a potential defect having a higher probability;
    upon identifying a potential defect in the part, analyzing a type of data about the part other than the image data and the composite data to identify a defect; and
    reporting the defect.

2. The method of claim 1, in which the analyzing of the composite data to identify a potential defect includes utilizing linear or non-linear registration.

3. The method of claim 2, wherein the type of data other than the image data and the composite data that is analyzed upon detection of a potential defect is a manufacturing record of the part.

4. The method of claim 3, wherein the part is a blade.

* * * * *